United States Patent
Jo

(10) Patent No.: US 10,340,729 B2
(45) Date of Patent: Jul. 2, 2019

(54) APPARATUS AND METHOD FOR CONTROLLING ELECTRIC CURRENTS WITH PULSE WIDTH MODULATION SIGNAL

(71) Applicant: LG CHEM, LTD., Seoul (KR)

(72) Inventor: Yongmin Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 234 days.

(21) Appl. No.: 15/302,076

(22) PCT Filed: Oct. 22, 2015

(86) PCT No.: PCT/KR2015/011211
§ 371 (c)(1),
(2) Date: Oct. 5, 2016

(87) PCT Pub. No.: WO2016/064224
PCT Pub. Date: Apr. 28, 2016

(65) Prior Publication Data
US 2017/0187232 A1    Jun. 29, 2017

(30) Foreign Application Priority Data

Oct. 22, 2014  (KR) ......................... 10-2014-0143654

(51) Int. Cl.
*H02J 7/00* (2006.01)
*H02J 7/24* (2006.01)
(Continued)

(52) U.S. Cl.
CPC .............. *H02J 7/245* (2013.01); *B60L 50/50* (2019.02); *B60L 53/20* (2019.02); *B60L 53/22* (2019.02);
(Continued)

(58) Field of Classification Search
CPC ............... H02J 7/0031; H02J 2007/004; H02J 2007/0037; H02J 7/245; H02J 7/022;
(Continued)

(56) References Cited

U.S. PATENT DOCUMENTS 5,471,128 A * 11/1995 Patino ................... H01M 10/44
                                                           320/128
5,977,749 A    11/1999 Kim
(Continued)

FOREIGN PATENT DOCUMENTS

CN    101447729 A      6/2009
CN    105449727 A  *   3/2016  ............ H02J 7/0019
(Continued)

OTHER PUBLICATIONS

International Search Report for PCT/KR2015/011211 dated Feb. 12, 2016.
(Continued)

*Primary Examiner* — Richard Isla
*Assistant Examiner* — Mohammed J Sharief
(74) *Attorney, Agent, or Firm* — Birch, Stewart, Kolasch & Birch, LLP

(57) ABSTRACT

Disclosed are an apparatus and a method for controlling electric currents. The apparatus for controlling electric currents according to the present invention includes: a pulse width modulation (PWM) signal generating unit configured to generate a PWM signal; a first switch unit connected with the PWM signal generating unit, and configured to receive the PWM signal and generate a switch control signal corresponding to the PWM signal; a second switch unit connected with the first switch unit, and configured to receive the switch control signal and connect or block a flow of a current from a rectifier to a battery according to the switch control signal; and a current decreasing unit connected with (Continued)

the second switch unit, and configured to decrease a current value of a current passing through the second switch unit and provide the battery with a current having the decreased current value.

18 Claims, 3 Drawing Sheets

(51) Int. Cl.

| | | |
|---|---|---|
| *G01R 31/382* | (2019.01) | |
| *H01M 10/052* | (2010.01) | |
| *H01M 10/42* | (2006.01) | |
| *H01M 10/44* | (2006.01) | |
| *H01M 10/48* | (2006.01) | |
| *H02J 7/14* | (2006.01) | |
| *H02M 3/156* | (2006.01) | |
| *H02J 7/02* | (2016.01) | |
| *H02J 7/04* | (2006.01) | |
| *B60L 50/50* | (2019.01) | |
| *B60L 53/22* | (2019.01) | |
| *B60L 53/20* | (2019.01) | |
| *H02M 1/32* | (2007.01) | |

(52) U.S. Cl.
CPC ........ *G01R 31/382* (2019.01); *H01M 10/052* (2013.01); *H01M 10/425* (2013.01); *H01M 10/44* (2013.01); *H01M 10/48* (2013.01); *H02J 7/022* (2013.01); *H02J 7/045* (2013.01); *H02J 7/047* (2013.01); *H02J 7/1453* (2013.01); *H02M 3/156* (2013.01); *B60L 2210/12* (2013.01); *B60L 2210/30* (2013.01); *H01M 2010/4271* (2013.01); *H02M 2001/327* (2013.01); *Y02T 10/7005* (2013.01); *Y02T 10/7072* (2013.01); *Y02T 10/7233* (2013.01); *Y02T 10/7241* (2013.01); *Y02T 10/92* (2013.01); *Y02T 90/127* (2013.01); *Y02T 90/14* (2013.01)

(58) Field of Classification Search
CPC ........... H02J 7/04; H02J 7/1453; Y02E 60/12; H01M 10/48; H01M 10/052; H01M 10/425; H01M 10/44; H01M 2010/4271; B60L 11/18; B60L 11/1811; B60L 11/1812; B60L 2210/12; B60L 2210/30; G01R 31/3606; H02M 3/156; H02M 2001/327; Y02T 10/7005; Y02T 10/7072; Y02T 10/7233; Y02T 10/7241; Y02T 90/127; Y02T 90/14
USPC ........................................................ 320/134
See application file for complete search history.

(56) References Cited

U.S. PATENT DOCUMENTS

| | | | |
|---|---|---|---|
| 6,144,187 A | 11/2000 | Bryson | |
| 6,803,746 B2 | 10/2004 | Aker et al. | |
| 2003/0102845 A1 | 6/2003 | Aker et al. | |
| 2008/0094036 A1* | 4/2008 | Yamashita | ............ H01M 10/44 320/162 |
| 2010/0259227 A1 | 10/2010 | Gale et al. | |
| 2011/0127974 A1 | 6/2011 | Fukushi | |
| 2012/0081068 A1 | 4/2012 | Odaohhara et al. | |
| 2012/0268063 A1 | 10/2012 | Qiu et al. | |
| 2014/0125120 A1 | 5/2014 | Bang | |
| 2014/0159496 A1* | 6/2014 | Lee | ........................ H02J 1/10 307/80 |
| 2015/0042292 A1* | 2/2015 | Mao | ........................ H02J 7/045 320/162 |
| 2016/0049812 A1* | 2/2016 | Li | ........................ H02J 7/0019 320/107 |

FOREIGN PATENT DOCUMENTS

| | | |
|---|---|---|
| JP | 6-197468 A | 7/1994 |
| JP | 2000-134916 A | 5/2000 |
| JP | 2001-157443 A | 6/2001 |
| JP | 2011-114984 A | 6/2011 |
| JP | 2012-80696 A | 4/2012 |
| KR | 10-2005-0043732 A | 5/2005 |
| WO | WO 2012/010613 A1 | 1/2012 |

OTHER PUBLICATIONS

Kim et al. "Optimized Design for Electric Vehicle Quick Charging System in Consideration of Economic Feasibility", International Journal of Control and Automation, Apr. 2014, vol. 7, No. 4, pp. 235-246.
Office Action for KR 10-2014-0143654 dated Jul. 19, 2016.
Written Opinion of the International Searching Authority for PCT/KR2015/011211 dated Feb. 12, 2016.
European Search Report for Appl. No. 15852020.5 dated Dec. 18, 2017.

* cited by examiner

[Figure 1]
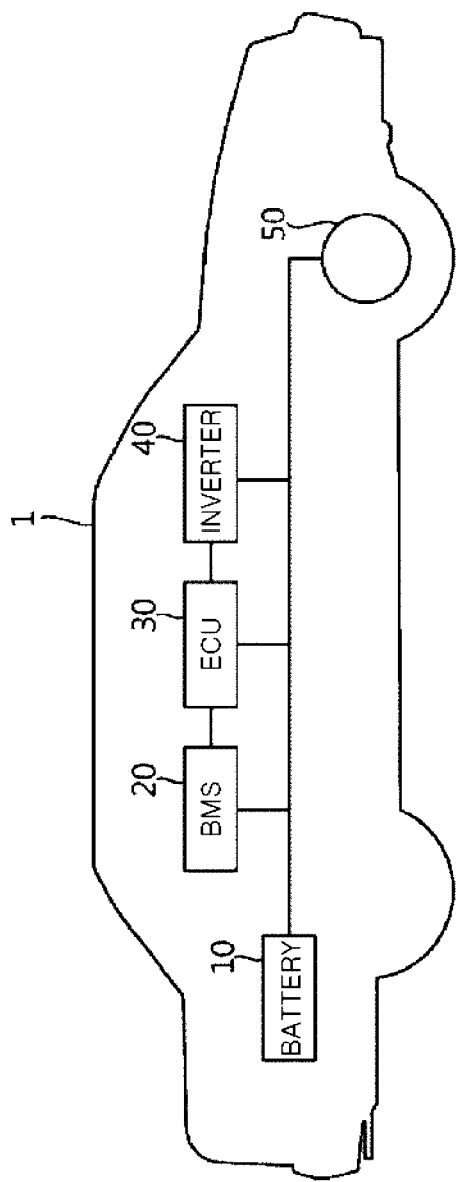

[Figure 2]
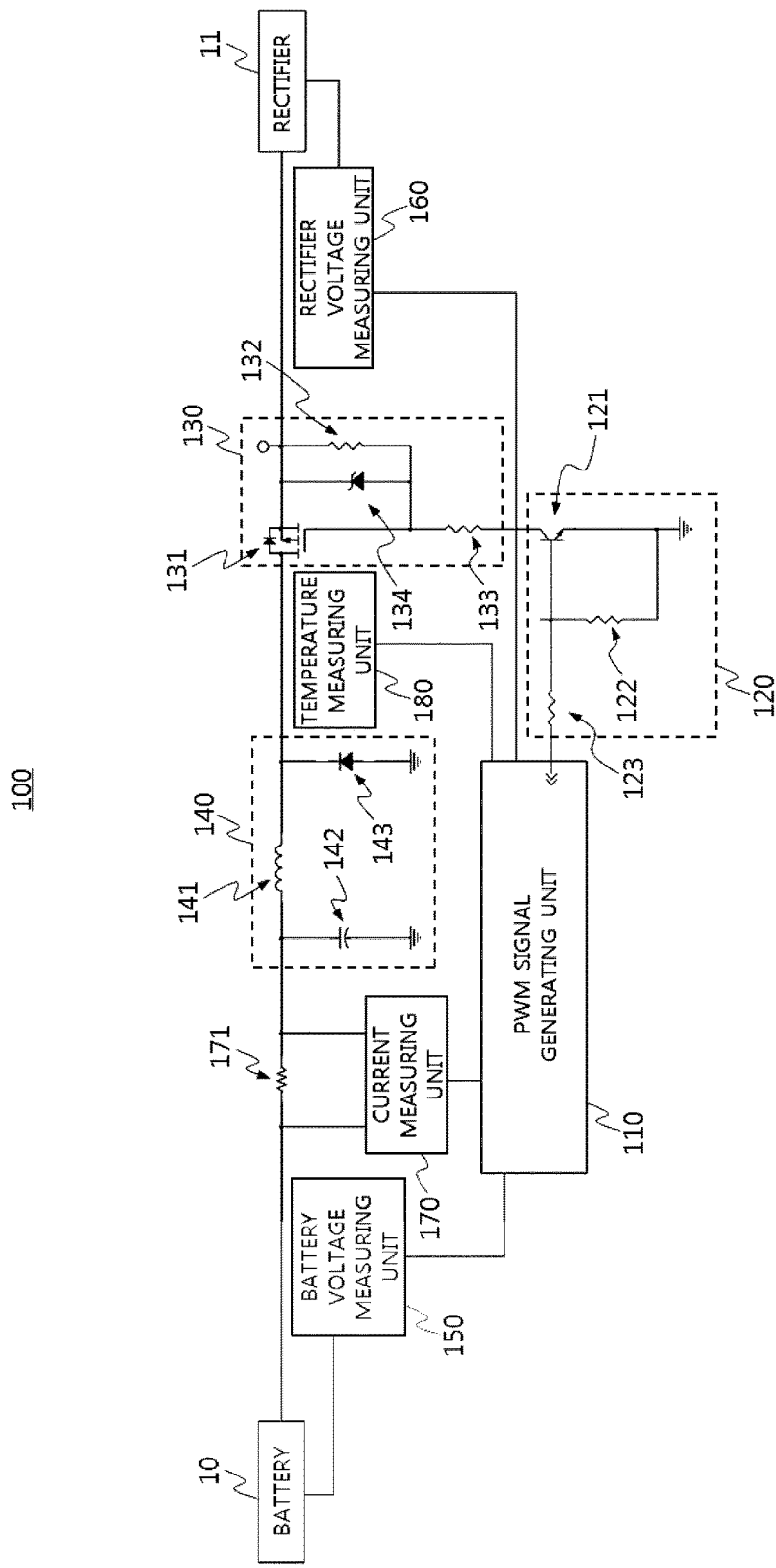

[Figure 3]
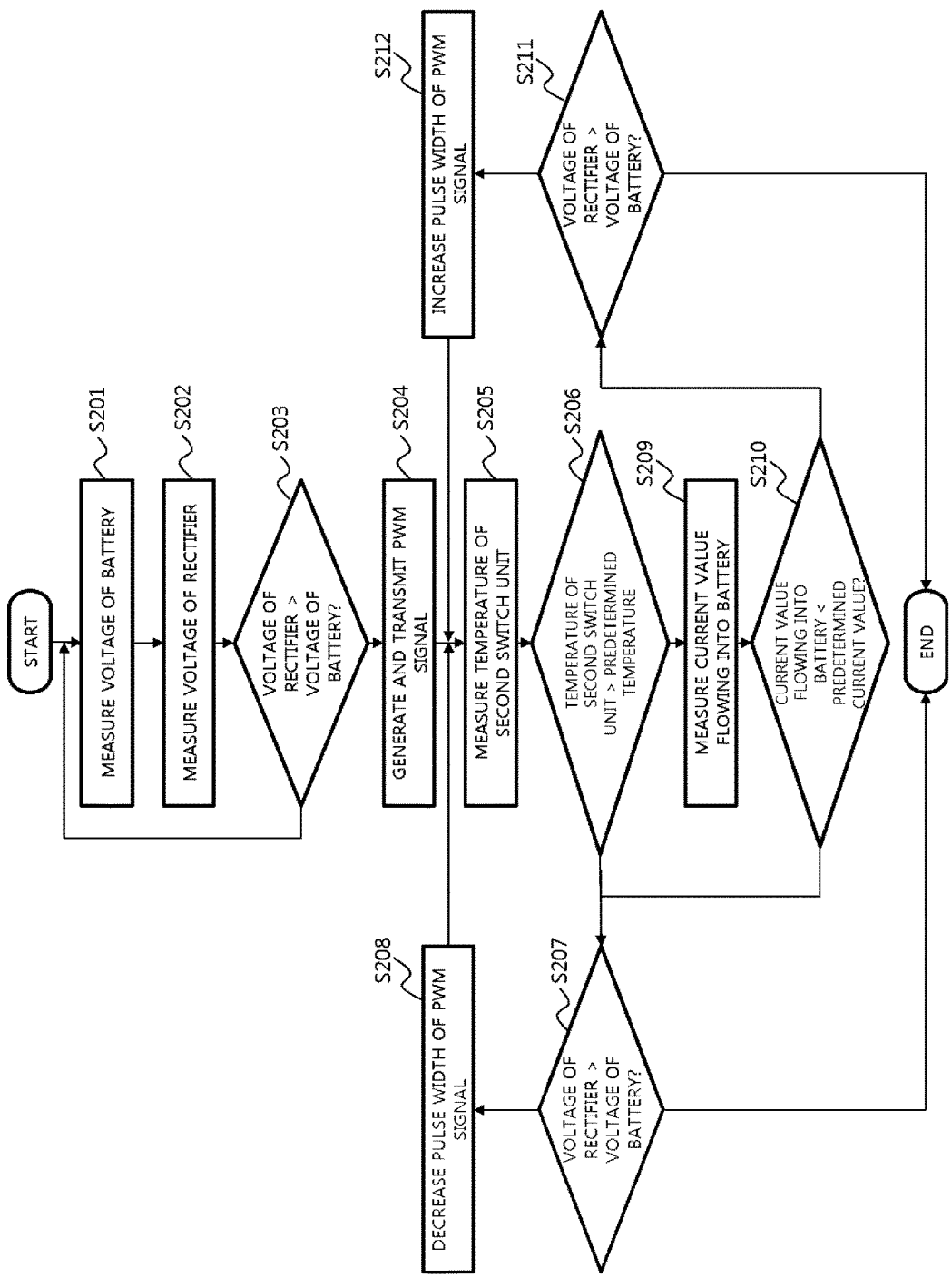

APPARATUS AND METHOD FOR CONTROLLING ELECTRIC CURRENTS WITH PULSE WIDTH MODULATION SIGNAL

TECHNICAL FIELD

This application claims priority to and the benefit of Korean Patent Application No. 10-2014-0143654 filed in the Korean Intellectual Property Office on Oct. 22, 2014, the entire contents of which are incorporated herein by reference.

The present invention relates to an apparatus and a method for controlling electric currents, and more particularly, to an apparatus and a method for controlling electric currents, which generate a pulse width modulation (PWM) signal, control a P-channel field effect transistor (FET) through a switch control signal corresponding to the PWM signal, decrease a current value of a current passing through the P-channel FET, and provide the current having the decreased current value to a battery, thereby controlling the current so that the large amount of current does not suddenly flow from a rectifier to the battery, and thus preventing a problem of failure of a battery and the like.

BACKGROUND ART

A secondary battery, which has high application easiness according to a product group and an electric characteristic, such as a high energy density, has been universally applied to an electric vehicle (EV), a hybrid vehicle (HV), and the like driven by an electric driving source, or an energy storage system (ESS), an uninterruptible power supply (UPS) system, or the like using a medium and large battery used for household or industry, as well as a portable device.

The secondary battery attracts attention as a new energy source that is environmentally-friendly and improves energy efficiency in that it is possible to innovatively decrease use of fossil fuel, which is the primary advantage, while not generating a by-product when using energy.

The battery applied to the EV or the energy storage source is generally used in a form, in which a plurality of unit secondary battery cells is combined, to improve adaptiveness to a high capacity environment, which, however, is not essentially applied to a case where the secondary battery is implemented as a battery of a portable terminal and the like.

In general, a power source used for charging the battery is a direct current, and a power source generated and produced through a motor and the like is an alternating current. Accordingly, in order to charge the battery, it is necessary to convert the alternating current power source, which is generated and produced, into the direct current power source, and a rectifier performs the conversion. That is, the battery receives a current required for charging through the rectifier.

In a case of a lead storage battery in the related art, which is used for a vehicle and the like before a lithium secondary battery, internal resistance of the lead storage battery is high and thus a current value of a current flowing into the battery during the charging is not large, so that there is no concern in view of problems incurred in a battery, and thus a current control function of limiting the current flowing into the battery is not required. Accordingly, the rectifier connected with the lead storage battery in the related art does not have the current control function.

In contrast to this, in a case of the recent lithium secondary battery used for an EV and the like, internal resistance of the lithium secondary battery is low and thus a current value of the current flowing into the battery during charging is large, so that a current control function of limiting the current value is required.

Accordingly, in a case where it is desire to replace the lead storage battery with the lithium secondary battery in a device using the existing lead storage battery, there is a problem in that it is impossible to easily replace the lead storage battery due to the non-existence of the current control function.

Further, in equipment, which uses a plurality of batteries by connecting the plurality of batteries in parallel due to a necessity of a high capacity and the like, it is difficult for the rectifier to control a current, such that it is necessary to separately perform the current control function in order to protect the battery.

DETAILED DESCRIPTION OF THE INVENTION

Technical Problem

The present invention has been made in an effort to provide an apparatus and a method for controlling electric currents, which generate a pulse width modulation (PWM) signal, control a P-channel field effect transistor (FET) through a switch control signal corresponding to the PWM signal, decrease a current value of a current passing through the P-channel FET, and provide the current having the decreased current value to a battery, thereby controlling the current so that the large amount of current does not suddenly flow from a rectifier to the battery, and thus preventing a problem of failure of a battery and the like.

Technical Solution

An exemplary embodiment of the present invention provides an apparatus for controlling electric currents, including: a pulse width modulation (PWM) signal generating unit configured to generate a PWM signal; a first switch unit connected with the PWM signal generating unit, and configured to receive the PWM signal and generate a switch control signal corresponding to the PWM signal; a second switch unit connected with the first switch unit, and configured to receive the switch control signal and connect or block a flow of a current from a rectifier to a battery according to the switch control signal; and a current decreasing unit connected with the second switch unit, and configured to decrease a current value of a current passing through the second switch unit and provide the battery with a current having the decreased current value.

The apparatus may further include: a battery voltage measuring unit configured to measure a voltage of the battery; and a rectifier voltage measuring unit configured to measure a voltage of the rectifier, in which the PWM signal generating unit may transmit the PWM signal when the voltage of the rectifier is higher than the voltage of the battery.

The apparatus may further include a current measuring unit configured to measure a current value, which passes through the current decreasing unit and flows into the battery, in which the PWM signal generating unit may decrease a pulse width of the PWM signal when the measured current value is equal to or larger than a predetermined current value, and increase the pulse width of the PWM signal when the measured current value is smaller than the predetermined current value.

The apparatus may further include a temperature measuring unit configured to measure a temperature of the second switch unit, in which the PWM signal generating unit may decrease the pulse width of the PWM signal when the measured temperature is higher than a predetermined temperature.

The first switch unit may include an NPN-type transistor.

The second switch unit may include a P-channel field effect transistor (FET).

The current decreasing unit may be a buck converter, which removes a high frequency component of a waveform of a current passing through the second switch unit, and outputs an average of a current value of the current, in which the high frequency component is removed, as a current value.

Another exemplary embodiment of the present invention provides a method of controlling electric currents, including: generating, by a pulse width modulation (PWM) signal generating unit, a PWM signal; receiving, by a first switch unit connected with the PWM signal generating unit, the PWM signal and generating a switch control signal corresponding to the PWM signal; receiving, by a second switch unit connected with the first switch unit, the switch control signal and connecting or blocking a flow of a current from a rectifier to a battery according to the switch control signal; and decreasing, by a current decreasing unit connected with the second switch unit, a current value of a current passing through the second switch unit and providing the battery with a current having the decreased current value.

The method may further include: measuring, by a battery voltage measuring unit, a voltage of the battery; measuring, by a rectifier voltage measuring unit, a voltage of the rectifier; and transmitting, by the PWM signal generating unit, the PWM signal when the voltage of the rectifier is higher than the voltage of the battery.

The method may further include: measuring, by a current measuring unit, a current value, which passes through the current decreasing unit and flows into the battery; and when the measured current value is equal to or larger than a predetermined current value, decreasing, by the PWM signal generating unit, a pulse width of the PWM signal, and when the measured current value is smaller than the predetermined current value, increasing, by the PWM signal generating unit, the pulse width of the PWM signal.

The method may further include: measuring, by a temperature measuring unit, a temperature of the second switch unit; and decreasing, by the PWM signal generating unit, the pulse width of the PWM signal when the measured temperature is higher than a predetermined temperature.

The first switch unit may include an NPN-type transistor.

The second switch unit may include a P-channel field effect transistor (FET).

The current decreasing unit may be a buck converter, which removes a high frequency component of a waveform of a current passing through the second switch unit, and outputs an average of a current value of the current, in which the high frequency component is removed, as a current value.

Advantageous Effects

According to exemplary embodiments of the present invention, it is possible to provide the apparatus and the method for controlling electric currents, which generate a pulse width modulation (PWM) signal, control a P-channel field effect transistor (FET) through a switch control signal corresponding to the PWM signal, decrease a current value of a current passing through the P-channel FET, and provide the current having the decreased current value to a battery, thereby controlling the current so that the large amount of current does not suddenly flow from a rectifier to the battery, and thus preventing a problem of failure of a battery and the like.

BRIEF DESCRIPTION OF DRAWINGS

FIG. 1 is a diagram schematically illustrating an electric vehicle to which a current control apparatus according to an exemplary embodiment of the present invention is applicable.

FIG. 2 is a view schematically illustrating the current control apparatus according to the exemplary embodiment of the present invention.

FIG. 3 is a flowchart illustrating a current control method according to an exemplary embodiment of the present invention.

BEST MODE

The present invention will be described in detail below with reference to the accompanying drawings. Herein, the repeated description, the detailed description of a known function and configuration that may make the purpose of the present invention unnecessarily ambiguous will be omitted. Exemplary embodiments of the present invention are provided so that those skilled in the art may more completely understand the present invention. Accordingly, the shape, the size, etc., of elements in the figures may be exaggerated for explicit comprehension.

Throughout the specification and the claims, unless explicitly described to the contrary, the word "comprise" and variations such as "comprises" or "comprising" will be understood to imply the inclusion of stated elements but not the exclusion of any other elements.

In addition, the term " . . . unit" described in the specification means a unit for processing at least one function and operation and may be implemented by hardware components or software components and combinations thereof.

FIG. 1 is a diagram schematically illustrating an electric vehicle to which a current control apparatus according to an exemplary embodiment of the present invention is applicable.

FIG. 1 illustrates an example, in which the current control apparatus according to the exemplary embodiment of the present invention is applied to an electric vehicle 1, but the current control apparatus according to the exemplary embodiment of the present invention is applicable to any technical field, such as an energy storage system (ESS) for household or industry or an uninterruptible power supply (UPS) system, to which a secondary battery is applicable, in addition to the electric vehicle.

The electric vehicle 1 may include a battery 10, a battery management system (BMS) 20, an electronic control unit (ECU) 30, an inverter 40, and a motor 50.

The battery 10 is an electric energy source for driving the electric vehicle 1 by providing driving force to the motor 50. The battery 10 may be charged or discharged by the inverter 40 according to the driving of the motor 50 or an internal combustion engine (not illustrated).

Here, the kind of battery 10 is not particularly limited, and examples of the battery 10 may include a lithium ion battery, a lithium polymer battery, a nickel cadmium battery, a nickel hydrogen battery, a nickel zinc battery, and the like.

Further, the battery 10 may be formed of a battery pack, in which a plurality of battery cells is connected in series and/or in parallel. Further, one or more battery packs are provided to form the battery 10.

The BMS 20 according to the present invention may include a current control apparatus 100 (see FIG. 2) to be described below, or may be connected to the current control apparatus and operated. The BMS 20 may generate a pulse width modulation (PWM) signal, control a P-channel field effect transistor (FET) through a switch control signal corresponding to the PWM signal, decrease a current value of a current passing through the P-channel FET, and provide the battery 10 with a current having the decreased current value.

The ECU 30 is an electronic control device for controlling a state of the electric vehicle 1. For example, the ECU 30 determines a torque level based on information about an accelerator, a brake, a speed, and the like, and controls an output of the motor 50 to correspond to torque information.

Further, the ECU 30 transmits a control signal to the inverter 40 so that the battery 10 is charged or discharged by the BMS 20.

The inverter 40 makes the battery 10 be charged or discharged based on the control signal of the ECU 30.

The motor 50 drives the electric vehicle 1 based on control information (for example, the torque information) transmitted from the ECU 30 by using electric energy of the battery 10.

Hereinafter, the current control apparatus and method according to an exemplary embodiment of the present invention will be described with reference to FIGS. 2 and 3.

FIG. 2 is a view schematically illustrating the current control apparatus according to the exemplary embodiment of the present invention.

Referring to FIG. 2, the current control apparatus 100 according to the exemplary embodiment of the present invention is connected between the battery 10 and a rectifier 11, and controls a current so that the large amount of current does not suddenly flow from the rectifier 11 to the battery 10 to prevent failure of the battery and the like.

The current control apparatus 100 according to the exemplary embodiment of the present invention may include a PWM signal generating unit 110, a first switch unit 120, a second switch unit 130, a current decreasing unit 140, a battery voltage measuring unit 150, a rectifier voltage measuring unit 160, a current measuring unit 170, and a temperature measuring unit 180. The current control apparatus 100 illustrated in FIG. 2 is in accordance with the exemplary embodiment, and the constituent elements of the current control apparatus 100 are not limited to the exemplary embodiment illustrated in FIG. 2, and some constituent elements may be added, changed, or deleted as necessary.

The PWM signal generating unit 110 generates a PWM signal. The PWM signal is a signal, in which a pulse amplitude is uniform, but a width of the pulse is changed according to the amplitude of the modulation signal and modulated, and when the amplitude of the modulation signal is large, the width of the pulse is increased, and when the amplitude of the modulation signal is small, the width of the pulse is decreased. In the exemplary embodiment, the PWM signal generating unit 110 may be implemented in a form of a micro controller unit (MCU) included in the BMS 20.

The first switch unit 120 is connected with the PWM signal generating unit 110, and receives the PWM signal and generates a switch control signal corresponding to the PWM signal. In the exemplary embodiment, the first switch unit 120 may be formed of a transistor switch including an NPN-type transistor 121 and two resistors 122 and 123, and is identically operated to a transistor switch including a general NPN-type transistor. An operation principle of the transistor switch including the NPN-type transistor is publicly known, so that a detailed description thereof will be omitted.

In the first switch unit 120, a base is connected with the PWM signal generating unit 110, a collector is connected with the second switch unit 130, and an emitter is connected with a ground. The first switch unit 120 receives the PWM signal from the PWM signal generating unit 110, and when the PWM signal is high, the first switch unit 120 becomes an on-state, and when the PWM signal is low, the first switch unit 120 becomes an off-state.

The second switch unit 130 is connected with the first switch unit 120, and receives the switch control signal and connects or blocks a flow of a current from the rectifier 11 to the battery 10 according to the switch control signal. In the exemplary embodiment, the second switch unit 130 may include a P-channel FET 131, two transistors 132 and 133, and a diode 134, and the two resistors 132 and 133 serve to distribute a voltage of power applied from the rectifier 11, and the diode 134 serves to uniformly maintain a voltage applied to the P-channel FET 131. In the exemplary embodiment, the diode 134 may be a Zener diode.

In the second switch unit 130, a gate is connected with the first switch unit 120, a source is connected with the rectifier 11, and a drain is connected with the current decreasing unit 140. The second switch unit 130 receives the switch control signal from the first switch unit 120, and when the PWM signal is high, the first switch unit 120 becomes the on-state, so that a voltage is applied to the two resistors 132 and 133, LOW is input into the gate as the switch control signal while the voltage is applied to the gate and the source of the P-channel FET 131, and the P-channel FET 131 becomes an on-state, and by contrast, when the PWM signal is low, the first switch unit 120 becomes the off-state, so that the P-channel FET 131 also becomes an off-state.

Accordingly, the current from the rectifier 11 flows in a form of a pulse switched to high and low in response to the PWM signal.

The current decreasing unit 140 is connected with the second switch unit 130, and decreases a current value of a current passing through the second switch unit 130 and provides the battery 10 with the current having the decreased current value. In the exemplary embodiment, the current decreasing unit 140 may be a buck converter, which removes a high frequency component in a waveform of the current passing through the second switch unit 130, and outputs an average value of the current value of the current, in which the high frequency component is removed, as the current value. In this case, the current decreasing unit 140 may include an inductor 141, a capacitor 142, and a diode 143.

When the current in the form of the pulse flowing from the rectifier 11 is high, the current flows to the inductor 141, and thus, energy is accumulated in the inductor 141 and the current increases and flows to the capacitor 142 and the battery 10. Further, when the current in the form of the pulse flowing from the rectifier 11 is low, the diode 143 makes an inductor current that is energy accumulated in the inductor 141 flow to the capacitor 142 and the battery 10. In this case, the inductor current is decreased until the current in the form of the pulse flowing from the rectifier 11 becomes high again.

That is, the current decreasing unit 140 formed of the inductor 141, the capacitor 142, and the diode 143 smooths the current in the form of the pulse flowing from the rectifier 11 and outputs the smoothed current as a direct current. In this case, a current value of the current output from the current decreasing unit 140 is smaller than the current value of the rectifier 11.

The battery voltage measuring unit 150 measures a voltage of the battery 10, and the rectifier voltage measuring unit 160 measures a voltage of the rectifier 11. In the exemplary embodiment, when the voltage of the rectifier 11 measured by the rectifier voltage measuring unit 160 is higher than the voltage of the battery 10 measured by the battery voltage measuring unit 150, the PWM signal generating unit 110 may start the charging of the battery 10 by transmitting the PWM signal.

The current measuring unit 160 measures a current value, which passes through the current decreasing unit 140 and flows into the battery 10. In the exemplary embodiment, the PWM signal generating unit 110 may decrease the pulse width of the PWM signal when the current value measured by the current measuring unit 160 is equal to or larger than a predetermined current value, and the PWM signal generating unit 110 may increase the pulse width of the PWM signal when the current value measured by the current measuring unit 160 is smaller than a predetermined current value. That is, when the current value flowing into the battery 10 is equal to or larger than the predetermined current value, the PWM signal generating unit 110 may decrease the pulse width of the PWM signal and decrease the current value flowing into the battery 10, and when the current value flowing into the battery 10 is smaller than the predetermined current value, the PWM signal generating unit 110 may increase the pulse width of the PWM signal and increase the current value flowing into the battery 10.

The current measuring unit 160 may measure a current value flowing into the battery 10 by measuring a current flowing in a resistor 171 between the current decreasing unit 140 and the battery 10. In this case, the resistor 171 may be a shunt resistor.

The temperature measuring unit 170 measures a temperature 180 of the second switch unit 130. In the exemplary embodiment, the PWM signal generating unit 110 may decrease the pulse width of the PWM signal when the measured temperature is higher than a predetermined temperature. That is, when the temperature 180 of the second switch unit is higher than the predetermined temperature, so that there is a concern in that a problem is generated in the P-channel FET 131 of the second switch unit 130, the PWM signal generating unit 110 may decrease the pulse width of the PWM signal and decrease the current value flowing in the P-channel FET 131.

FIG. 3 is a flowchart illustrating a current control method according to an exemplary embodiment of the present invention.

The current control method according to the exemplary embodiment of the present invention may be performed by the current control apparatus according to the exemplary embodiment of the present invention described with reference to FIG. 2, and in order to avoid overlapping descriptions, detailed descriptions of the constituent elements described with reference to FIG. 2 will be applied with the description of FIG. 2 and omitted.

Referring to FIG. 3, when the current control method according to the exemplary embodiment of the present invention starts, first, the battery voltage measuring unit measures a voltage of a battery (S201), and the rectifier voltage measuring unit measures a voltage of the rectifier (S202). Then, it is confirmed whether the voltage of the rectifier is higher than the voltage of the battery (S203), and when the voltage of the rectifier is higher than the voltage of the battery, the PWM signal generating unit generates a PWM signal and transmits the generated PWM signal (S204), and makes the charging of the battery start. In the exemplary embodiment, the PWM signal generated by the PWM signal generating unit may have a pulse width of 10%.

When the PWM signal is generated and transmitted by the PWM signal generating unit in operation S204, the first switch unit connected with the PWM signal generating unit receives the PWM signal and generates a switch control signal corresponding to the PWM signal, the second switch unit connected with the first switch unit receives the switch control signal and connects or blocks a flow of the current or from the rectifier to the battery according to the switch control signal, and the current decreasing unit connected with the second switch unit decreases a current value of the current passing through the second switch unit and provides the battery with the current having the decreased current value to charge the battery.

When the voltage of the rectifier is equal to or lower than the voltage of the battery in operation S203, the method returns to operation S201 again and measures the voltage of the battery.

When the PWM signal is generated and transmitted in operation S204, the temperature measuring unit a temperature of the second switch unit is measured (S205). Then, it is confirmed whether the measured temperature is higher than a predetermined temperature (S206), and when the measured temperature is higher than the predetermined temperature, it is confirmed whether the voltage of the rectifier is still higher than the voltage of the battery (S207), and when the voltage of the rectifier is still higher than the voltage of the battery, the PWM signal generating unit 110 decreases the pulse width of the PWM signal (S208), and continues the charging of the battery, and when the voltage of the rectifier is equal to or lower than the voltage of the battery, the charging of the battery is stopped and the current control method according to the exemplary embodiment of the present invention is terminated.

When the measured temperature is equal to or lower than the predetermined temperature in operation S206, the current measuring unit measures a current value, which passes through the current decreasing unit and flows into the battery (S209). Then, it is confirmed whether the measured current value is smaller than the predetermined current value (S210), and when the measured current value is equal to or larger than the predetermined current value, it is confirmed whether the voltage of the rectifier is still higher than the voltage of the battery (S207), and when the voltage of the rectifier is still higher than the voltage of the battery, the pulse width of the PWM signal is decreased (S208), and then the charging of the battery is continued, and when the voltage of the rectifier is equal to or lower than the voltage of the battery, the charging of the battery is stopped and the current control method according to the exemplary embodiment of the present invention is terminated.

When the current value measured in operation S209 is smaller than the predetermined current value, it is confirmed whether the voltage of the rectifier is still higher than the voltage of the battery (S211), and when the voltage of the rectifier is still higher than the voltage of the battery, the pulse width of the PWM signal is increased (S212), and the charging of the battery is continued, and when the voltage of the rectifier is equal to or lower than the voltage of the battery, the charging of the battery is stopped and the current control method according to the exemplary embodiment of the present invention is terminated.

The aforementioned current control method has been described with reference to the flowchart illustrated in the drawing. For the simple description, the method is illustrated in a series of blocks and described, but the present invention is not limited to the sequence of the blocks, and some blocks may be performed in a different order from or at the same time as that of other blocks illustrated and described in the present specification, and various branches, flow paths, and block sequences achieving the same or similar result may be carried out. Further, all of the blocks illustrated for carrying out the method described in the present specification may not be required.

In the above, the specific exemplary embodiment of the present invention has been illustrated and described, but it is apparent to those skilled in the art that the technical spirit of the present invention is not limited by the accompanying drawings and the described contents, and may be modified in various forms without departing from the scope and the spirit of the present invention, and the modifications are considered to belong to the claims of the present invention without departing from the spirit of the present invention.

The invention claimed is:

1. An apparatus for controlling electric currents, comprising:
    a pulse width modulation (PWM) signal generating unit configured to generate a PWM signal based on a difference between a voltage of a battery and a voltage of a rectifier;
    a first switch unit connected with the PWM signal generating unit, and configured to receive the PWM signal and generate a switch control signal corresponding to the PWM signal;
    a second switch unit connected with the first switch unit, and configured to receive the switch control signal and connect or block a flow of a current from the rectifier to the battery according to the switch control signal; and
    a current decreasing unit connected with the second switch unit, and configured to decrease a current value of a current passing through the second switch unit and provide the battery with a current having the decreased current value.

2. The apparatus of claim 1, further comprising:
    a battery voltage measuring unit configured to measure the voltage of the battery; and
    a rectifier voltage measuring unit configured to measure the voltage of the rectifier,
    wherein the PWM signal generating unit transmits the PWM signal when the voltage of the rectifier is higher than the voltage of the battery.

3. The apparatus of claim 1, further comprising:
    a current measuring unit configured to measure a current value, which passes through the current decreasing unit and flows into the battery,
    wherein the PWM signal generating unit decreases a pulse width of the PWM signal when the measured current value is equal to or larger than a predetermined current value, and increases the pulse width of the PWM signal when the measured current value is smaller than the predetermined current value.

4. The apparatus of claim 1, further comprising:
    a temperature measuring unit configured to measure a temperature of the second switch unit,
    wherein the PWM signal generating unit decreases the pulse width of the PWM signal when the measured temperature is higher than a predetermined temperature.

5. The apparatus of claim 1, wherein the first switch unit includes an NPN-type transistor.

6. The apparatus of claim 1, wherein the second switch unit includes a P-channel field effect transistor (FET).

7. The apparatus of claim 1, wherein the current decreasing unit is a buck converter, which removes a high frequency component of a waveform of a current passing through the second switch unit, and outputs an average of a current value of the current, in which the high frequency component is removed, as a current value.

8. The apparatus of claim 1, wherein a high PWM signal puts the first switch unit in an on-state and a low PWM signal puts the first switch in an off-state.

9. The apparatus of claim 1, wherein a base of the first switch unit is connected to the PWM signal generating unit and a collector of the first switch unit is connected to the second switch unit.

10. The apparatus of claim 1, wherein a gate of the second switch unit is connected to the first switch unit, a source of the second switch unit is connected to a rectifier and a drain of the second switch unit is connected to the current decreasing unit.

11. A method of controlling electric currents, comprising:
    measuring, by a battery voltage measuring unit, a voltage of a battery;
    measuring, by a rectifier voltage measuring unit, a voltage of a rectifier;
    generating, by a pulse width modulation (PWM) signal generating unit, a PWM signal based on a difference between the voltage of the battery and the voltage of the rectifier;
    receiving, by a first switch unit connected with the PWM signal generating unit, the PWM signal and generating a switch control signal corresponding to the PWM signal;
    receiving, by a second switch unit connected with the first switch unit, the switch control signal and connecting or blocking a flow of a current from the rectifier to the battery according to the switch control signal; and
    decreasing, by a current decreasing unit connected with the second switch unit, a current value of a current passing through the second switch unit and providing the battery with a current having the decreased current value.

12. The method of claim 11, further comprising:
    transmitting, by the PWM signal generating unit, the PWM signal when the voltage of the rectifier is higher than the voltage of the battery.

13. The method of claim 11, further comprising:
    measuring, by a current measuring unit, a current value, which passes through the current decreasing unit and flows into the battery; and
    when the measured current value is equal to or larger than a predetermined current value, decreasing, by the PWM signal generating unit, a pulse width of the PWM signal, and when the measured current value is smaller than the predetermined current value, increasing, by the PWM signal generating unit, the pulse width of the PWM signal.

14. The method of claim 11, further comprising:
    measuring, by a temperature measuring unit, a temperature of the second switch unit; and
    decreasing, by the PWM signal generating unit, the pulse width of the PWM signal when the measured temperature is higher than a predetermined temperature.

15. The method of claim 11, wherein the first switch unit includes an NPN-type transistor.

16. The method of claim 11, wherein the second switch unit includes a P-channel field effect transistor (FET).

17. The method of claim 11, wherein the current decreasing unit is a buck converter, which removes a high frequency component of a waveform of a current passing through the second switch unit, and outputs an average of a current value of the current, in which the high frequency component is removed, as a current value.

18. The method of claim 11, further comprising placing the first switch unit in an on-state when the PWM signal is high and placing the first switch unit in an off-state when the PWM signal is low.

* * * * *